United States Patent
Shin

(10) Patent No.: US 6,242,328 B1
(45) Date of Patent: Jun. 5, 2001

(54) METHOD OF ACTIVATING COMPOUND SEMICONDUCTOR LAYER TO P-TYPE COMPOUND SEMICONDUCTOR LAYER

(75) Inventor: Hyun-eoi Shin, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/307,771

(22) Filed: May 10, 1999

(30) Foreign Application Priority Data

May 8, 1998 (KR) .................................................. 98-16501

(51) Int. Cl.[7] .......................... H01L 21/265; H01L 21/22; H01L 21/00
(52) U.S. Cl. ............................ 438/518; 438/569; 438/45; 438/46; 438/93
(58) Field of Search ................................ 438/22, 24, 29, 438/45, 518; 257/22, 66, 94, 103

(56) References Cited

U.S. PATENT DOCUMENTS

| | | | |
|---|---|---|---|
| 4,296,424 | * | 10/1981 | Shibasaki et al. ........................ 357/1 |
| 5,583,879 | * | 12/1996 | Yamazaki et al. ...................... 372/45 |
| 5,804,834 | * | 9/1998 | Shimoyama et al. .................. 257/22 |
| 5,825,052 | * | 10/1998 | Shakuda ................................. 257/94 |
| 5,898,258 | * | 4/1999 | Sakai et al. .......................... 313/309 |
| 5,914,498 | * | 6/1999 | Suzawa et al. ........................ 257/66 |
| 5,926,726 | * | 7/1999 | Bour et al. ............................ 438/507 |
| 5,953,595 | * | 9/1999 | Gosain et al. ........................ 438/158 |
| 6,020,602 | * | 2/2000 | Sugawara et al. .................... 257/103 |

OTHER PUBLICATIONS

ASM Handbook, vol. 10, Materials Characterization. p. 76.*

* cited by examiner

Primary Examiner—Jey Tsai
Assistant Examiner—Viktor Simkovic
(74) Attorney, Agent, or Firm—The Law Offices of Eugene M. Lee, PLLC

(57) ABSTRACT

A method of activating a compound semiconductor layer into a p-type compound semiconductor layer is provided. In order to reduce the electrical conductivity of the compound semiconductor layer grown by a VPE method, electromagnetic waves having energy larger than the band gap of the compound semiconductor layer are irradiated and annealing is performed. If the amount of the p-type impurities contained in the layer during growth thereof increases, the resistivity of the layer increases and an annealing temperature is lowered. Also, the contact resistance between the compound semiconductor layer and an electrode is reduced.

11 Claims, 4 Drawing Sheets

METHOD OF ACTIVATING COMPOUND SEMICONDUCTOR LAYER TO P-TYPE COMPOUND SEMICONDUCTOR LAYER

BACKGROUND OF THE INVENTION

1. Field of the Invention

The present invention relates to a method of activating a compound semiconductor layer, necessary for manufacturing a compound semiconductor device for use in an optical device such as a blue-green light emitting device, a violet laser diode, a UV light emitting device, a laser diode or a transistor, to a p-type compound semiconductor layer.

2. Description of the Related Art

FIG. 1 is a sectional view showing the structure of a typical GaN-based optical device. As shown in FIG. 1, the GaN-based optical device is constructed such that a buffer layer 2 is formed on a sapphire substrate 1, a GaN layer 3, an n-GaN layer 4, an InGaN layer 5 and a P-type GaN layer 6 are sequentially stacked thereon, and then a p-contact layer 7 and an n-contact layer 8 are formed. The GaN optical device emits a blue, violet or green light, etc. and has a short-wavelength to provide full color display. Also, the GaN-based optical device can be applied to fields of high-capacity recording media for storing information. Also, since the GaN-based optical device exhibits excellent thermal properties, it can be applied to electronic devices capable of operating at a high temperature.

Nitride series compound semiconductors which are rapidly being developed in view of commercialization of short wavelength optical devices, entail a problem in manufacturing a p-type semiconductor, in contrast with other series materials including GaAs.

There are several well-known methods for growing a compound semiconductor layer, including a metalorganic chemical vapor deposition (MOCVD) method, a molecular beam epitaxy method and a hydride vapor method. In a state where a GaN series compound semiconductor has a layer grown by a metalorganic chemical vapor deposition (MOCVD) method, for example, and doped with p-type impurities, the GaN layer cannot be used as a device due to its high resistivity. This is presumably because hydrogen, serving as a reaction gas during growth of the layer is bonded with p-type impurities to be contained in a crystal and thus acts to prevent the p-type impurities from being electrically activated. In order to solve this problem, there has been proposed a method of increasing electrical conductivity using an electron beam. According to this method, electron beams are irradiated into a grown layer, thereby reducing resistivity. However, this method entails the problem of the generation of defects on the surface of the layer, thus deteriorating the performance of the device. Also, since electron beams cannot be irradiated over a large surface, the irradiated electron beams, having only up to a small area where the electron beams can reach, must be sequentially scanned over the entire surface. Thus, this method is not suitable for mass production. Alternatively, there has been proposed an annealing method. According to this method, the resistivity is lowered by annealing a grown layer at a temperature of 400° C. or higher. However, with this method, since the grown layer must be exposed to a high temperature of 800–900° C., the surface of the layer may be damaged. Also, the impurities contained in the layer may be diffused during growth, thus deteriorating the performance of the manufactured device.

SUMMARY OF THE INVENTION

To solve the above problems, it is a feature of the present invention to provide a method of manufacturing a compound semiconductor device, and more specifically, to a method of activating a compound semiconductor layer, which can reduce the resistivity of Mg-doped GaN, to a p-type compound semiconductor layer, by using electromagnetic waves.

It is another feature of the present invention to provide a method of activating a compound semiconductor, which can lower an annealing temperature to a p-type compound semiconductor layer by increasing an Mg content.

It is another feature of the present invention to provide a method of reducing the contact resistance between the compound semiconductor and electrode, which can reduce the contact resistance by increasing an Mg content, to accomplish the feature of the present invention. There is provided a method of manufacturing a compound semiconductor device using a compound semiconductor layer grown by a vapor phase epitaxy (VPE) method and doped with p-type impurities, and an electrode, comprising activating the compound semiconductor layer into a p-type compound semiconductor layer. By including the step of irradiating electromagnetic waves that can be absorbed into a p-type impurity doped compound semiconductor layer, onto the p-type impurity doped compound semiconductor layer.

In the present invention, it is preferred that the irradiating step is accompanied by annealing at a temperature of 350° C. or higher. In particular, if the p-type impurity doped compound semiconductor layer used in the irradiating step is an Mg-doped GaN layer, the electromagnetic waves preferably have a wavelength shorter than 385 nm in the air.

Also, the compound semiconductor layer is preferably formed of one gallium nitride-based semiconductor material selected from the group consisting of $In_xGa_{1-x}N$, $Al_xGa_{1-x}N$, $Al_xGa_yIn_zN$, $B_xGa_{1-x}N$, and $B_xAl_yGa_zN$ where $0 \leq x \leq 1$ in the case of a three-element mixed crystal compound, and $x+y+z=1$ in the case of four-element mixed crystal compound. Preferably, the p-type impurity of the compound semiconductor layer is at least one selected from the group consisting of Mg, Zn, Cd, Be, Ca and Ba.

To accomplish another feature of the present invention, there is provided a method of manufacturing a compound semiconductor device using a compound semiconductor layer grown by a vapor phase epitaxy (VPE) method and doped with p-type impurities, and an electrode, comprising, activating the compound semiconductor layer into a p-type compound semiconductor layer, by including the step of annealing the p-type semiconductor layer at a low temperature preferably of 200–850° C. when the p-type impurity-doped semiconductor layer contains more than $5 \times 10^{19}$ cm$^{-3}$ of Mg as p-type impurities.

According to another aspect of the present invention, there is provided a method of manufacturing a compound semiconductor device using a compound semiconductor layer grown by a vapor phase epitaxy (VPE) method and doped with p-type impurities, and an electrode, comprising reducing the contact resistance of the compound semiconductor layer by including the step of doping the p-type impurities into the compound semiconductor layer at an amount of more than two times of the amount required when the resistivity of the p-type impurity-doped compound semiconductor layer is the lowest.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Korean application no. 98-16501, filed May 8, 1998, is hereby incorporated by reference as if fully set forth herein. Hereinafter, a method of activating a compound semiconductor layer into a p-type compound semiconductor layer according to the present invention will be described in detail with reference to the accompanying drawings.

An important feature of the present invention lies in that the resistivity of a compound semiconductor layer is reduced by activating the compound semiconductor layer into a p-type compound semiconductor layer in order to enhance the performance of a compound semiconductor device. To achieve this, the methods described below can be used. First, in order to reduce the resistivity of a compound semiconductor layer grown by a vapor phase epitaxy (VPE) method and doped with p-type impurities, electromagnetic waves which can be absorbed into the compound semiconductor layer are irradiated thereon. Second, an annealing temperature is lowered by increasing the density of the p-type impurities contained in the compound semiconductor layer. Third, the contact resistance of the compound semiconductor layer is reduced.

Figure 1:
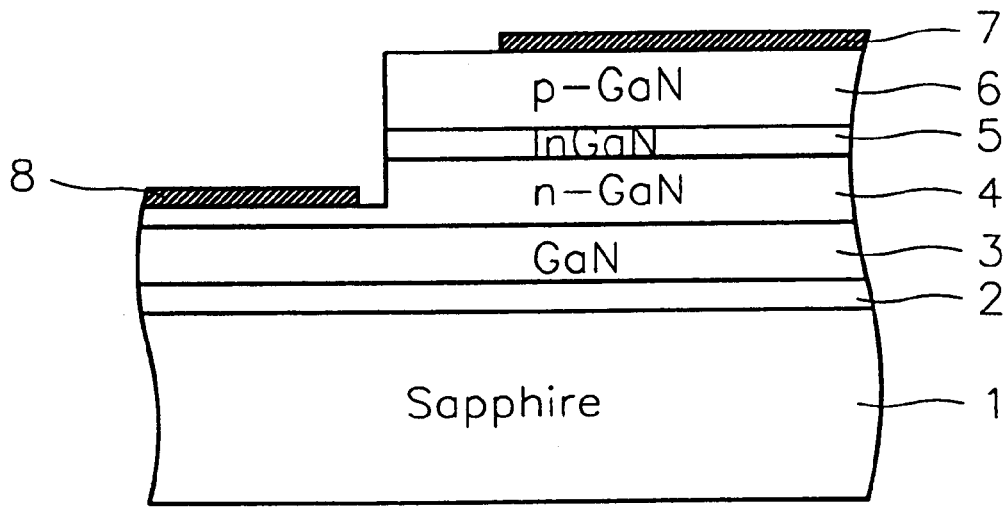
FIG. 1 is a sectional view showing the structure of a typical GaN-based grown optical device.
Figure 2:
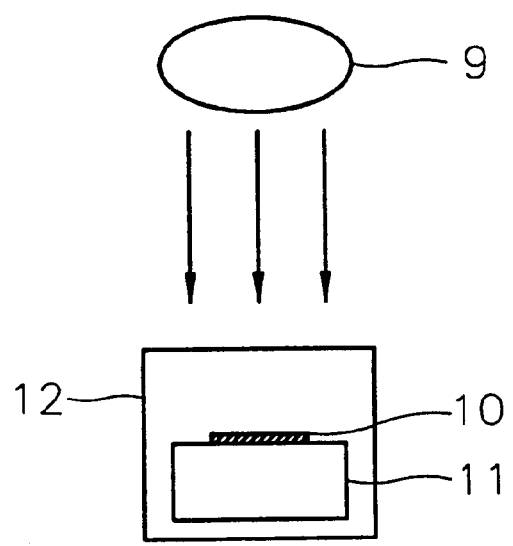
FIG. 2 is a schematic sectional view of an apparatus to which is applied a method of activating a GaN semiconductor into a p-type compound semiconductor layer using electromagnetic waves according to the present invention.

In more detail, in the first method, electromagnetic waves having energy larger than the minimum energy that can be absorbed into a compound semiconductor layer, that is, a band gap energy, are irradiated on the compound semiconductor layer. That is to say, in an activating process shown in FIG. 2, while electromagnetic waves which can be absorbed into a p-type impurity-doped compound semiconductor layer are irradiated from a light source 9 to a compound semiconductor layer sample 10, the sample 10 is annealed at a temperature of about 350° C. Here, reference numeral 11 denotes a heater for heating the sample 10 and reference numeral 12 denotes a chamber. In this case, if the p-type impurity-doped compound is an Mg-doped GaN layer, its resistivity is reduced during the irradiation of UV light, which is an electromagnetic wave having energy larger than the band gap energy. Also, when the annealing is carried out at a temperature of 350° C. or higher, the resistivity is more greatly reduced. Ba, Be, Ca, Cd or Zn can be used as the p-type impurity in addition to Mg. In the case of using an AlGaN layer, instead of the Mg-doped GaN layer, as the compound semiconductor layer, a similar phenomenon to the above resulted. That is to say, with respect to InGaN, AlGaN, or AlGaInN, which are mostly gallium nitride-based III–V group compounds, in the case when electromagnetic waves having energy larger than the band gap energy thereof are irradiated thereon, the same effects can be attained.

To obtain the above-described result, experiments were carried out using small-sized GaN samples, for the purpose of easily measuring the resistivity of Mg-doped GaN. Circular electrodes of the same size as those of the small-sized GaN samples were deposited on top of the samples, and then current which flowed therebetween was measured. The circular electrodes were formed of a Pd metal having a diameter of 0.6 mm and were arranged in a two-dimensional array with a separation distance of 0.6 mm. Changes in resistivity were compared among the circular electrodes by measuring current which flowed through the circular electrodes at a voltage of 5 V. Since the currents measured at the same voltage are inversely proportional to the resistivity of a layer, the current value is a suitable indicator for comparison of the resistivity of the respective samples. Here, a process of reducing the resistivity of the p-type impurity doped compound semiconductor layer is referred to as an activating process. Also, in order to measure the contact resistance of the Mg-doped GaN semiconductor, a widely used transmission line method (TLM) was employed. Seven Pd electrodes each having a width of 200 $\mu$m and a length 100 $\mu$m, were arranged in a line and spaced apart from one another by distances of 5, 10, 15, 20, 25, and 30 $\mu$m, respectively. The contact resistance was obtained by measuring differential resistance values at a voltage of 0.1 V.

A mercury arc lamp was used as the light source of the UV light used in the activating process. The light intensities were kept constant at 110 mW/cm$^2$ in all experiments, unless otherwise specifically mentioned. The time for the activating process was fixed to 30 minutes. The degree of activation does not significantly change in a temporal range of no less than several minutes. The p-type compound semiconductor layer used in the above-described experiments was constructed such that an undoped GaN layer having a thickness of about 1 $\mu$m was deposited on a sapphire substrate and an Mg-doped GaN layer having a thickness of about 1 $\mu$m was grown thereon.

Figure 3:
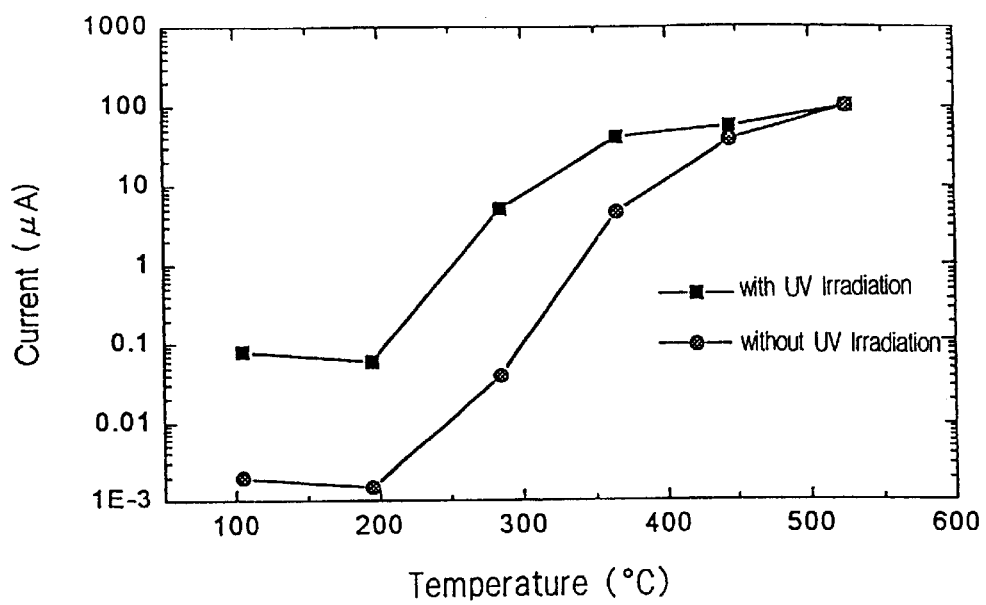
FIG. 3 is a graph showing various values of the current which flows through activated p-type compound semiconductor layer samples, with and without UV light irradiation at various temperatures.

FIG. 3 shows the current flowing through activated p-type compound semiconductor layer samples, measured with and without UV light irradiation at various temperatures. FIG. 3 also shows the influence of UV light on the change in current depending on the temperature. By annealing, a grown semiconductor through which little current flows is converted into a semiconductor through which much current flows. Here, the UV light facilitates the annealing so that the same amount of current can flow at a lower temperature. Under the condition that the same amount of current flows, the annealing with UV light irradiation allows the temperature to fall about 70 through 80° C., compared with the case in which the annealing is performed without UV light irradiation. Also, when UV light is irradiated, the amount of current increased even with annealing at a very low temperature, by about 30 through 40 times, compared with the semiconductor as grown, through which little current flows. Otherwise, when compound semiconductor layer samples were annealed at temperatures of 100° C. and 200° C., respectively, without UV light irradiation, the result indicated that the amount of current flowing through the samples was similar to that of the grown compound semiconductor layer which was not annealed. Namely, if the UV light is irradiated, the amount of current which flows through the samples greatly increases by applying only a slight amount of thermal energy to the samples. Also, when the annealing temperature is 350° C. or higher, with UV light irradiation, the amount of current tends not to increase any more. Accordingly, it is possible to obtain a p-type impurity-doped GaN semiconductor having low resistivity by performing an activating process in a temperature range exceeding the temperature of 350° C.

Annealing at a temperature lower than that in the conventional activating process can be done to avoid surface damage which may be caused in a grown semiconductor, thereby lowering the contact resistance generated between the same and an electrode.

In order to measure contact resistance, two samples are prepared from the same substrate and different activation processes are performed thereon. That is to say, in order to activate an Mg-doped GaN layer, a conventional high-temperature annealing and a low-temperature annealing with UV light irradiation were performed on two samples and then specific contact resistivity thereof were measured using a TLM. The results showed that the specific contact resistivity of a sample activated at 800° C. was in the range of $4.03 \times 10^{-2}$ $\Omega$ cm$^2$ to $1.16 \times 10^{-2}$ $\Omega$ cm$^2$ and that of a sample activated at 370° C. with UV light irradiation was in the range of $4.33 \times 10^{-4}$ $\Omega$ cm$^2$ to $5.62 \times 10^{-6}$ $\Omega$ cm$^2$. Such a difference in contact resistance, that is, about 100 times, is a considerably large difference, which implies that the surface of the semiconductor has been damaged at a high temperature to thus cause defects, thereby increasing the contact resistance between the semiconductor and the electrode.

Figure 4:
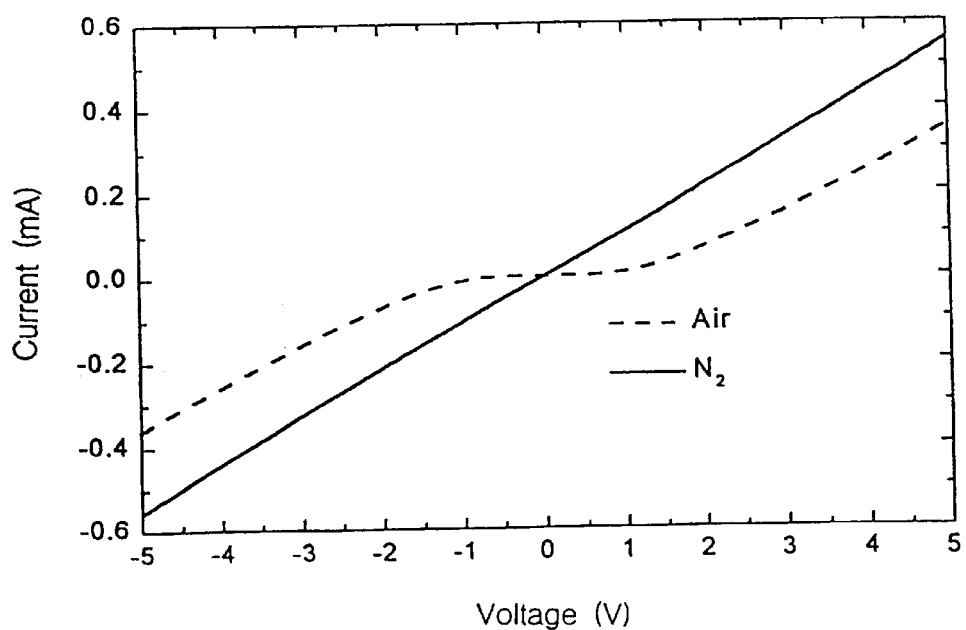
FIG. 4 is a graph showing voltage-current characteristics of two p-type compound semiconductor layer samples activated in a nitrogen atmosphere and in an atmosphere of air at a high temperature of 800° C.

Also, in contrast with the conventional high-temperature annealing, the low-temperature annealing with UV light irradiation prevents oxide or other reactants from being generated on the surface of the compound semiconductor layer. Thus, it is not necessary to control the atmosphere gas for the activating process. FIG. 4 shows the voltage-current characteristics of two samples activated in two atmospheres, that is, a nitrogen atmosphere and an atmosphere of air, at a high temperature of 800° C., in which a dotted line for the sample activated in the atmosphere of air is curved, rather than straight, at around 0 V, and a solid line for the sample activated in the nitrogen atmosphere is straight at around 0 V. The reason why the dotted line for the sample activated in the atmosphere of air is curved at around 0 V is that an ohmic contact is not generated between the compound semiconductor layer and the electrode. In other words, the ohmic contact between the compound semiconductor layer and the electrode is generated only when the activating process is performed in the nitrogen atmosphere. On the other hand, the samples having such characteristics as shown in FIG. 3, which are activated in the atmosphere of air, result in straight lines in view of their current-voltage characteristics, although not shown. This means that ohmic resistance is generated properly in the interface between the compound semiconductor layer and the electrode since oxide or other reactants are not produced on the surface of the layer due to the low-temperature activating process with UV light irradiation. In such a manner, since the atmosphere is not necessarily controlled to be a nitrogen atmosphere, the equipment for activation can be simplified. Thus, even if the low-temperature activating process with UV light irradiation is performed in the atmosphere of air, the resulting activation is similar to activation performed in the nitrogen atmosphere.

Even if a compound semiconductor grown by a conventional VPE method is doped with the p-type impurities, the resistivity thereof is high. While not intending to be bound by any theory, the inventors believe that the reason of the foregoing is because the p-type impurities are bonded to hydrogen, thus not serving as acceptors. In this regard, in the conventional activating process, the hydrogen bonded with p-type impurities is separated by high-temperature annealing, thereby reducing the resistivity. Alternatively, as hydrogen separating methods, there have been proposed an electron beam irradiation method or a minority carrier injection method, both being considered to be based on the reaction between hydrogen and electrons. That is to say, if electrons are injected, the bond between hydrogen and p-type impurities is weakened, thereby removing hydrogen from the bond at a low temperature without high-temperature annealing, thus reducing the resistivity of the semiconductor layer. For electron injection, the inventors believe that the present invention is based on the principle in which light which can be absorbed into a grown p-type impurity-doped semiconductor layer is irradiated thereon to thus generate an electron-hole pair in the semiconductor layer. Here, the light capable of generating electrons which help the activation has energy larger than the band gap energy of the semiconductor layer. In general, the light absorption into the semiconductor starts to occur in the band gap energy and increases as the wavelength of the irradiated light becomes shorter. No light absorption occurs in the case where the energy of the light irradiated to the semiconductor is lower than the band gap energy of the semiconductor.

Figure 5:
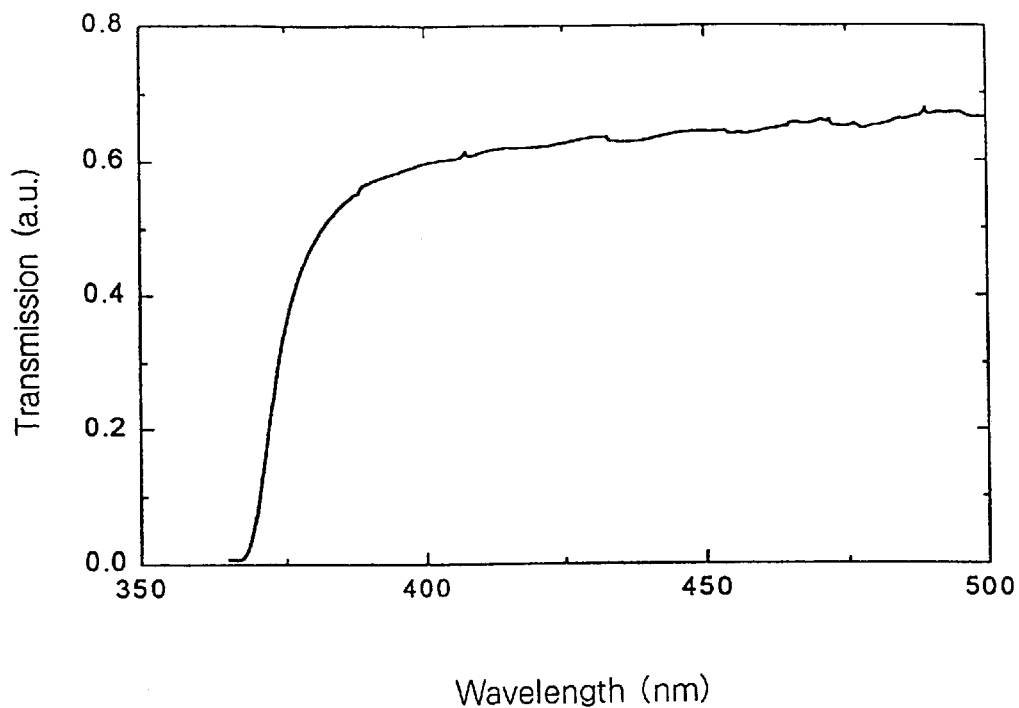
FIG. 5 is a light transmission spectrum for observing a wavelength range in which light absorption occurs, in the case when light of various wavelengths is irradiated onto a p-type impurity-doped GaN layer sample.

In the case of a p-type impurity-doped GaN layer, as shown in FIG. 5, light having a shorter wavelength than 385 nm is absorbed into the layer, thereby creating charges. In other words, the light having a shorter wavelength than 385 nm is absorbed into the Mg-doped GaN layer, thus facilitating the activation. A mercury arc lamp is suitable for use as a UV light source in the wavelength range of 385 nm. The mercury arc lamp used in the experiments of the present invention emits large amounts of electromagnetic waves not only in the UV light region but also in the visible ray region. In order to confirm the effect attained by UV light irradiation, the activation was performed with only a visible ray using a filter which does not transmit UV light. The filter used in the experiment cannot transmit an electromagnetic wave having a shorter wavelength than 420 nm. Meanwhile, current of about 130 $\mu$A flows through the sample activated at 370° C. while irradiating the UV light, whereas current of only about 10 $\mu$A flows through the sample annealed with light which has been UV filtered, that is, the UV light is shielded by the filter. This implies that the UV light is a main factor for the activation of an Mg-doped GaN layer.

In the case of absorbing electromagnetic waves into the Mg-doped GaN layer, the transmission depth varies according to the absorption rate. In other words, if the UV light is absorbed almost entirely around the surface of the Mg-doped GaN layer to be activated, the effect of the UV light may not reach the inside of the layer. An undoped GaN layer is grown on a sapphire substrate to a thickness of 1 $\mu$m and then the Mg-doped GaN layer used in the experiment is grown thereon. In order to verify the influence of the transmission depth of the UV light on the activation of the Mg-doped GaN layer as grown, both a sample having the GaN layers positioned on the top of the substrate and a sample having the GaN layers positioned at the bottom of the substrate, were activated, while irradiating the UV light. If the transmission depth of the UV light is short, the UV light is absorbed into the undoped layer present almost entirely around the surface of the sample having the GaN layers positioned at the bottom of the substrate. Thus, the sample will exhibit a low level of current. However, the actual experimental result showed that the amounts of current flowing through the two samples were almost the same, which means that the influence of the transmission depth of the UV light is not considerable.

Figure 6:
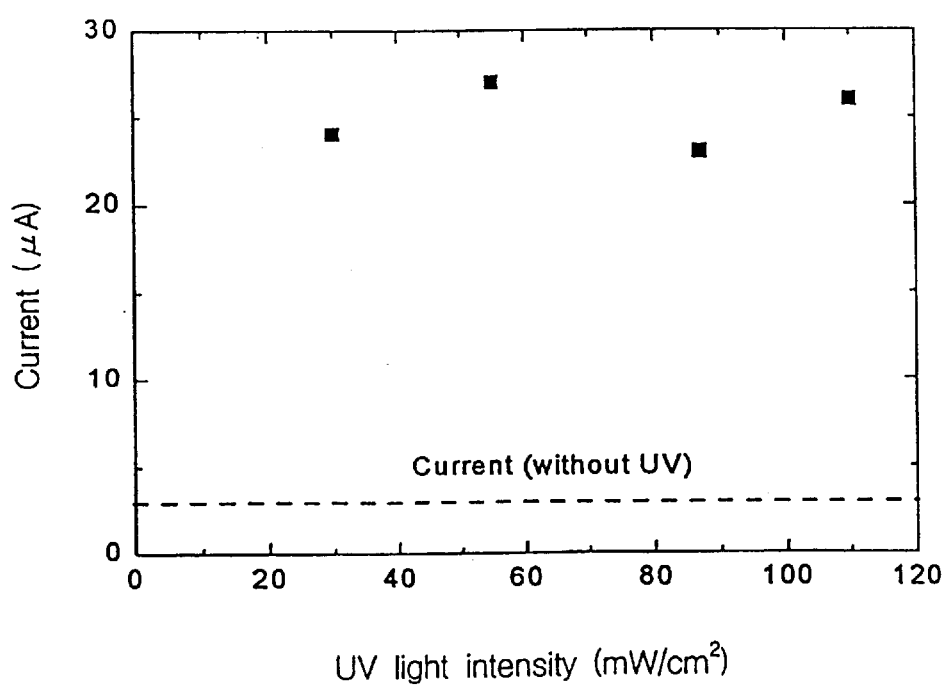
FIG. 6 is a graph showing the change in currents depending on the intensity of UV light irradiated onto the p-type compound semiconductor layer sample.

FIG. 6 shows the change of current depending on the intensity of the irradiated UV light. The maximum emission light intensity of the mercury arc lamp used in the experiment was 110 mW/cm$^2$. In this case, the conducting current was about 25 $\mu$A. Also, the current which flows through the sample activated without UV light irradiation at the same temperature as that for the case with UV light irradiation, was 2.9 $\mu$A. This current level is indicated with a dotted line in FIG. 6. In the case of the sample activated with UV light irradiation, even if the intensity of the UV light was changed, there was no change in current. In the experiment of the present invention, due to the limitation of a light source, the intensity of the UV light could not be lowered to below 30 mW/cm$^2$. However, as shown in FIG. 6, the change in current is not dependent upon the light intensity at all. Accordingly, the conclusion is that a slight amount of light is enough to attain the activation of a p-type compound semiconductor layer.

Figure 7:
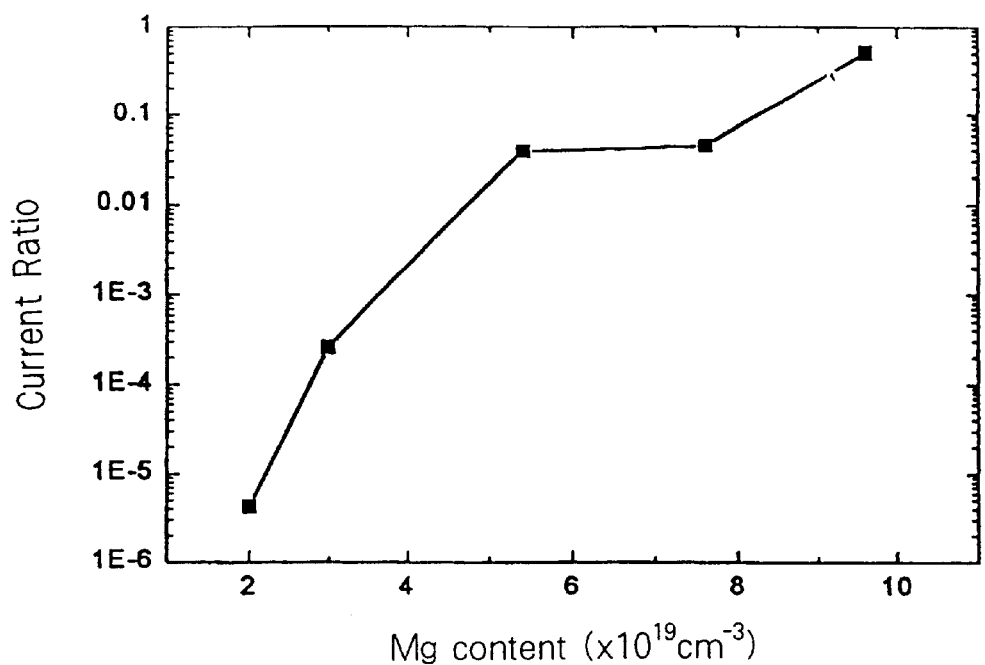
FIG. 7 is a graph showing the ratio of a current value measured in a sample activated at 520° C. with UV irradiation, to a current value measured in a sample activated at 370° C. without UV irradiation, with respect to p-type compound semiconductor layer samples containing different amounts of Mg.

As an alternative method for implementing the present invention, in order to reduce the resistivity of a compound semiconductor layer grown by a VPE method and doped with p-type impurities, there is proposed a method of lowering an annealing temperature by increasing the density of the p-type impurities contained in the compound semiconductor layer. According to this method, the degree of activation of the compound semiconductor layer can be increased by low-temperature annealing only without UV light irradiation, while increasing the amount of Mg as a p-type impurity. FIG. 7 is a graph showing the ratio of a current value measured in a sample activated at 520° C. with UV irradiation, to a current value measured in a sample activated at 370° C. without UV irradiation, with respect to p-type compound semiconductor layer samples containing different amounts of Mg. In other words, the ratio of degrees of activation of the respective samples at 370° C. is shown in FIG. 7. When the amount of Mg contained in the sample is 9.6×10$^{19}$ cm$^{-3}$, the current value is more than 50% of the saturation current. This suggests that activation can be attained only by over-doping Mg at a low temperature, without UV light irradiation. When the amount of Mg exceeds 5×10$^{19}$ cm$^{-3}$, current of about 4% of the saturation current flows through the sample. Here, the activation can be sufficiently attained by a low-temperature annealing of 200–850° C. The same results can also be obtained in the case of p-type impurities such as Ba, Be, Ca, Cd or Zn in addition to Mg.

Also, in the case of using an AlGaN layer as the compound semiconductor layer, the same phenomenon as above results. Thus, with respect to InGaN, AlGaN, or AlGaInN, which are mostly gallium nitride-based III–V group compounds, activation can be attained at a low temperature by over-doping such p-type impurities as stated above.

In general, as the amount of p-type impurities contained in the semiconductor layer increases, the hole carrier density increases. Accordingly, the resistivity of the semiconductor layer is lowered and contact resistance between the semiconductor layer and an electrode is lowered. In particular, the hole carrier density is an important variable in determining the contact resistance between the semiconductor layer and the electrode. However, in the case of a nitride semiconductor, if the amount of the p-type impurities increases to more than 1.5–2×10$^{19}$ cm$^{-3}$, the hole carrier density is reduced and the resistivity of the semiconductor layer increases. In the present invention, although the hole carrier density is decreased due to over-doping of Mg to more than 1.5–2×10$^{19}$ cm$^{-3}$, low contact resistance is created between a layer containing a large amount of p-type impurities and the electrode.

Factors for determining the operation voltage of a semiconductor device in manufacturing the same, are resistivity of the semiconductor layer and contact resistance between the semiconductor layer and the electrode. In the case of a GaN layer, the contact resistance between the electrode and the p-type GaN layer is the most important factor because the band gap energy thereof is large and the hole carrier density thereof is low. Therefore, the overall resistance of the device can be reduced by using a p-type GaN layer grown under the condition that the contact resistance between the layer and the electrode is lowered even though the resistivity of p-type GaN layer is slightly increased. However, if Mg is doped excessively only for the purpose of reducing the contact resistance, the resistivity of the p-type GaN layer may become too large. Also, a considerably reduced hole carrier density may deteriorate the performance of a device such as an LED and a laser diode. In the present invention, to overcome this problem, there is proposed a structure in which the resistivity of the layer is reduced by forming an Mg-overdoped contact layer only on the part of surface of the semiconductor layer which contacts the electrode and doping an appropriate amount of Mg under the contact layer. The amount of Mg contained in the GaN layer in which the resistivity of the layer is lowest and the hole carrier density is highest is in the range of 1.5–2×10$^{19}$ cm$^{-3}$.

The samples used in this experiment were activated by performing annealing for four minutes at 800° C. Then, for comparison of contact resistances between the respective samples, differential resistance ($\Delta V/\Delta I$) between two electrodes spaced apart from each other by 5 $\mu$m was measured at 0.1 V. In the case of a large contact resistance, since a change in the measured values was too large depending on the distance between the respective electrodes, it was difficult to obtain the contact resistance by linear fitting. Accordingly, the measured resistances were directly compared to each other. In the case when two neighboring electrodes among various electrodes to be subjected to the TLM method, are closest to each other and a low voltage of about 0.1 V is applied to the two electrodes, the contact resistance between the semiconductor layer and the electrode is the largest part of the resistance between two electrodes closest to each other, measured at a low voltage. Thus, the contact resistances can be compared with each other by comparing the thus measured resistances.

Figure 8:
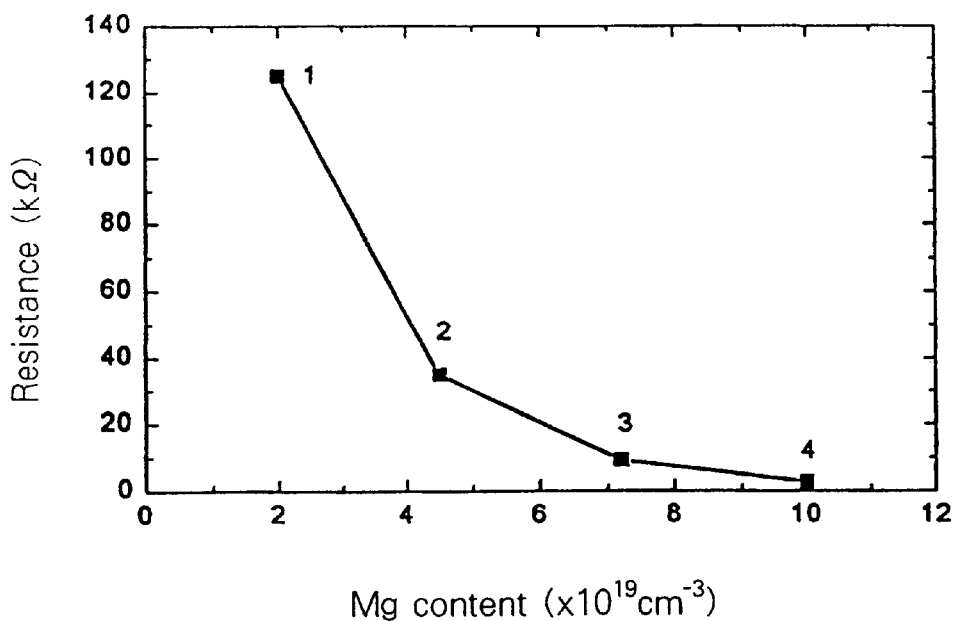
FIG. 8 is a graph showing the resistances measured when 0.1 V is applied to various p-type compound semiconductor layer samples containing different amounts of Mg.

FIG. 8 shows resistances measured when 0.1 V is applied to various p-type compound semiconductor layer samples containing different amounts of Mg. In FIG. 8, points 1 and 2 represent samples 1 and 2 each having a thickness of 1 $\mu$m and prepared by doping 2.0×10$^{19}$ cm$^{-3}$ and 4.5×10$^{19}$ cm$^{-3}$ of Mg uniformly thereinto, respectively, and points 3 and 4 represent samples 3 and 4 prepared by growing a 0.03 μm thick contact layer into which $7.2 \times 10^{19}$ cm$^{-3}$ and $10.0 \times 10^{19}$ cm$^{-3}$ of Mg were doped, respectively, each on a 0.9 μm thick layer uniformly doped with $2.0 \times 10^{19}$ cm$^{-3}$ of Mg. This is for preventing the resistance of the layer from increasing too much when Mg is over doped on the overall layer, because, in the measured resistance values for the four samples shown in FIG. 8, the resistance component due to the p-type GaN layer, being in the range of 0.4 kΩ through 0.8 kΩ, is a very small value, compared to the overall resistance. Thus, the measured resistance values are largely attributed to the contact resistance between the layer and the electrode. As shown in FIG. 8, the contact resistance is reduced as the amount of Mg increases. In particular, the contact resistance is sharply reduced when the amount of Mg exceeds $4.5 \times 10^{19}$ cm$^{-3}$. Here, the amount of Mg contained in the layer is about two or three times that for the case of a layer having the lowest resistivity, that is, $1.5$–$2 \times 10^{19}$ cm$^{-3}$.

The resistivity of the layer per se is 1.6 Ω cm in the case of the sample 1 containing a small amount of Mg, and 2.2 Ω cm in the case of the sample 2 containing a large amount of Mg, which implies that the resistivity of the layer exhibits an inverse relationship to that of the contact resistance. That is to say, when the resistivity of the layer increases due to Mg being over doped, the contact resistance between the layer and the electrode is reduced. The samples 3 and 4 are each comprised of two layers containing different amounts of Mg. The resistance values shown in FIG. 8 are values measured with respect to the amounts of Mg in the contact layer. Here, the sample containing a larger amount of Mg in the contact layer has a lower contact resistance. Since an equal amount of Mg to that doped into the sample 1 was doped into the 0.9 μm thick layers in the samples 3 and 4, that is, the largest part of each of the samples 3 and 4, the resistivity of the layer per se is almost the same in the samples 1, 3, and 4.

When the thickness of the contact layer is increased from 0.03 μm to 0.1 μm in the sample containing $7.2 \times 10^{19}$ cm$^{-3}$ of Mg in the contact layer, the resistance value is reduced from about 7 kΩ through 10 kΩ, as shown in FIG. 8, to about 0.84 kΩ through 1.0 kΩ, which is very low. This corresponds to a contact resistance of $1.58 \times 10^{-3}$ Ω cm$^2$. Such a phenomenon presumably occurs due to the diffusion of Mg, which can be caused by a high-temperature activation process. When the over-doped layer is thin, the amount of Mg around the surface contacting the electrode is reduced due to the diffusion of Mg, compared to the case of the layer as grown. The diffusion occurs most intensively on a boundary where the difference in the amounts of Mg is large. Thus, it is possible to reduce the influence of the diffusion around the surface, by increasing the thickness of the over-doped contact layer so that the surface contacting the electrode becomes further away from the boundary where a difference in amounts of Mg is large. Also, in the case of using an AlGaN layer as the compound semiconductor layer, the same phenomenon as above results.

As described above, according to the present invention, the method of activating a compound semiconductor layer into a p-type compound semiconductor layer can be accomplished as follows. First, the resistivity of the p-type semiconductor is lowered by irradiating electromagnetic waves in the range of wavelengths that can be absorbed into the compound semiconductor grown by a VPE. Also, specific contact resistivity between the compound semiconductor and an electrode is further lowered. Second, using the fact that an annealing temperature suitable for activation is lowered as the amount of p-type impurities doped into the compound semiconductor layer during the growth of the compound semiconductor layer is increased, the resistivity of the compound semiconductor layer can be lowered solely by a low-temperature annealing, by increasing the density of p-type impurities without UV light irradiation.

Also, according to a method of reducing the contact resistance of the compound semiconductor layer of the present invention, the contact resistance can be reduced by increasing the density of the p-type impurities.

The invention has been described with reference to particularly preferred embodiments thereof. Those skilled in the art appreciate that various modifications can be made to the invention without departing from the spirit and scope thereof.

What is claimed is:

1. A method of manufacturing a compound semiconductor device having at least (1) a compound semiconductor layer grown by a vapor phase epitaxy (VPE) method and doped with p-type impurities, and (2) an electrode, comprising activating the compound semiconductor layer into a p-type compound semiconductor layer by annealing the p-type semiconductor layer at a temperature of 200–850° C., wherein the p-type impurity-doped semiconductor layer contains more than $5 \times 10^{19}$ cm$^{-3}$ of Mg as p-type impurities.

2. The method of claim 1, wherein the compound semiconductor layer is formed of at least one gallium nitride-based semiconductor material selected from the group consisting of In$_x$Ga$_{1-x}$N, Al$_x$Ga$_{1-x}$N, Al$_x$Ga$_y$In$_z$N, B$_x$Ga$_{1-x}$N, and B$_x$Al$_y$Ga$_z$N where $0 \leq x \leq 1$ in the case of a three-element mixed crystal compound, and $x+y+z=1$ in the case of four-element mixed crystal compound.

3. The method of claim 1, wherein the p-type impurity of the compound semiconductor layer is at least one selected from the group consisting of Zn, Cd, Be, Ca and Ba.

4. The method of claim 2, wherein the p-type impurity of the compound semiconductor layer is at least one selected from the group consisting of Zn, Cd, Be, Ca and Ba.

5. A method of manufacturing a compound semiconductor device having at least (1) a compound semiconductor layer grown by a vapor phase epitaxy (VPE) method and doped with p-type impurities, and (2) an electrode, comprising the steps of reducing the contact resistance of the compound semiconductor layer by doping the compound semiconductor layer with p-type impurities selected from the group consisting of Zn, Cd, Be, Ca and Ba in an amount of more than two times the amount required when the resistivity of the p-type impurity-doped compound semiconductor layer is the lowest.

6. The method according to claim 5, wherein the compound semiconductor layer is formed of at least one gallium nitride-based semiconductor material selected from the group consisting of In$_x$Ga$_{1-x}$N, Al$_x$Ga$_{1-x}$N, Al$_x$Ga$_y$In$_z$N, B$_x$Ga$_{1-x}$N, and B$_x$Al$_y$Ga$_z$N where $0 \leq x \leq 1$ in the case of a three-element mixed crystal compound, and $x+y+z=1$ in the case of four-element mixed crystal compound.

7. The method of claim 1 wherein the annealing is carried out at a temperature of 200–370° C.

8. The method of claim 1 wherein the p-type impurity doped semiconductor layer contains at least $9 \times 10^{19}$ cm$^{-3}$ of Mg as p-type impurities.

9. The method claim 5 comprising the steps of reducing the contact resistance of the compound semiconductor layer by doping the compound semiconductor layer with more than $4.5 \times 10^{19}$ cm$^{-3}$ of Mg as the p-type impurities, and forming an Mg-overdoped layer having a thickness of 0.03 to 0.1 μm by doping more than $4.5 \times 10^{19}$ cm$^{-3}$ of Mg as the p-type impurities only into the surface of the compound semiconductor layer contacting the electrode.

10. The method according to claim 9, wherein the compound semiconductor layer is formed of one gallium nitride-based semiconductor material selected from the group consisting of $In_xGa_{1-x}N$, $Al_xGa_{1-x}N$, $Al_xGa_yIn_zN$, $B_xGa_{1-x}N$ and $B_xAl_yGa_zN$ where $0 \leq x \leq 1$ in the case of a three-element mixed crystal compound, and $x+y+z=1$ in the case of four-element mixed crystal compound.

11. The method according to claim 1, wherein the p-type compound semiconductor layer is activated by irradiation from a light source and is annealed by heat from a heater which is different from the light source.

* * * * *